United States Patent [19] [11] 4,212,935
Canavello et al. [45] Jul. 15, 1980

[54] METHOD OF MODIFYING THE DEVELOPMENT PROFILE OF PHOTORESISTS

[75] Inventors: Benjamin J. Canavello, Stony Point; Michael Hatzakis, Ossining, both of N.Y.; Jane M. Shaw, Ridgefield, Conn.

[73] Assignee: International Business Machines Corporation, Armonk, N.Y.

[21] Appl. No.: 880,926

[22] Filed: Feb. 24, 1978

[51] Int. Cl.² .............................................. G03C 5/00
[52] U.S. Cl. .................................... 430/326; 430/191; 430/327; 430/330; 430/323; 430/324
[58] Field of Search .................. 96/36, 91 D, 49, 36.2, 96/33, 36.3, 35.1

[56] References Cited

U.S. PATENT DOCUMENTS

| 3,634,082 | 1/1972 | Christensen | 96/91 D |
|---|---|---|---|
| 3,759,711 | 9/1973 | Rauner et al. | 96/91 D |
| 3,827,908 | 8/1974 | Johnson et al. | 96/91 D |
| 3,841,874 | 10/1974 | Nishino | 96/49 |
| 3,868,254 | 2/1975 | Wemmers | 96/49 |
| 3,873,313 | 3/1975 | Horst et al. | 96/36 |
| 3,900,325 | 8/1975 | Christenson et al. | 96/91 D |
| 3,904,492 | 9/1975 | Rich et al. | 96/36 |
| 3,961,100 | 1/1976 | Harris et al. | 96/91 D |
| 3,969,118 | 7/1976 | Stohlhofen et al. | 96/91 D |
| 4,028,111 | 6/1977 | Iwasaki et al. | 96/91 D |
| 4,115,128 | 9/1978 | Kita | 96/91 D |

OTHER PUBLICATIONS

Hamel, C. J. et al., *IBM Tech. Discl. Bulletin*, vol. 18, No. 6, 11/1975, p. 1775.

Primary Examiner—Charles L. Bowers
Attorney, Agent, or Firm—Ronald L. Drumheller

[57] ABSTRACT

The cross-sectional profile which is produced upon development of a layer of alkali soluble resin-diazo ketone photoresist is modified by treating the layer with a solvent or solvent mixture which is different from but miscible with the solvent or solvent mixture used to form the resist layer. The treating solvent is believed to dilute the resist solvent in a surface layer portion of the resist thereby modifying the alkaline developer solubility of this portion. Undercut resist profiles may be obtained by this method with normal optical exposure of the resist.

24 Claims, 6 Drawing Figures

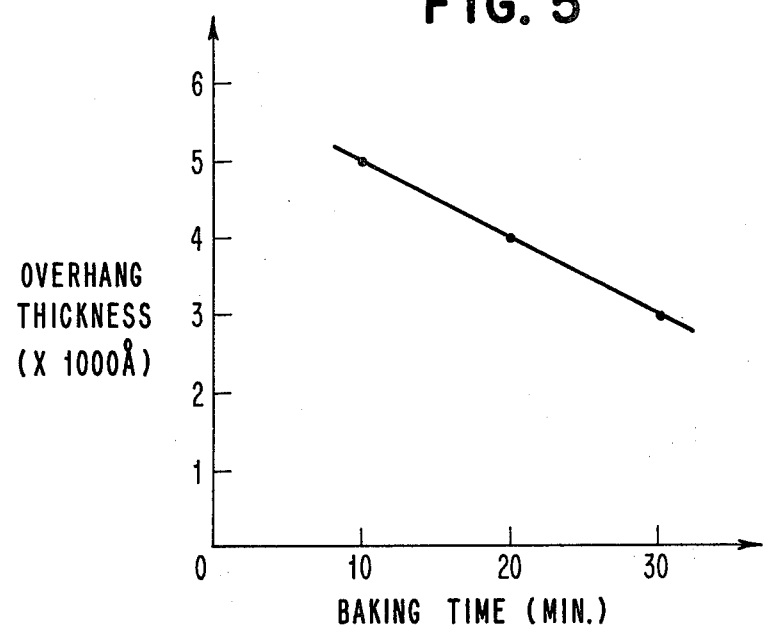
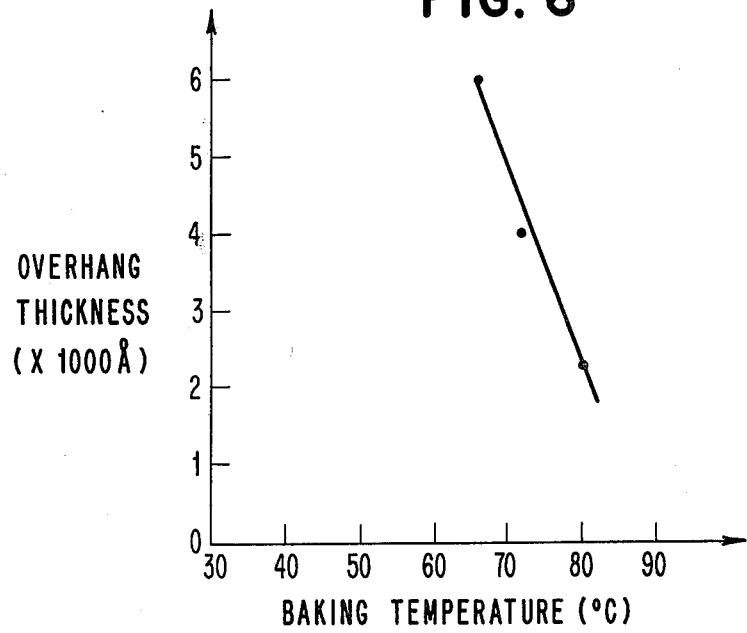

METHOD OF MODIFYING THE DEVELOPMENT PROFILE OF PHOTORESISTS

BACKGROUND OF THE INVENTION

1. Field of the Invention

This invention relates generally to methods of treating positive photoresist layers and more particularly relates to treatments of alkali soluble resin-diazo ketone photoresists which result in changing the developed resist profile. The invention is particularly useful in forming an undercut resist profile with normal optical exposure of a photoresist but is not limited thereto. Undercut resist profiles are needed, for example, in various microcircuit fabrication processes, especially when employing the lift-off technique.

2. Description of the Prior Art

An additive metallization technique, known as the "lift-off" technique, was developed with the advent of electron beam lithography. This technique utilizes the fact that electron scattering in a resist layer and backscattering from the underlying substrate create a pear-shaped energy absorption profile in the resist layer which results in an undercut profile after resist development. With an undercut in the resist image, metal may be evaporated over the entire resist surface and discontinuities will remain between the metal deposited through the resist openings onto the underlying substrate and the metal deposited on the resist top surface. When the resist layer then is removed with a suitable solvent, the metal on the resist is also removed and a clean and faithful reproduction of the image is obtained on the substrate in metal. This lift-off technique also may be used to form multilevel metal structures and any material or combination of materials which may be deposited by evaporation may be used instead of metal.

Undercut resist profiles may be easily obtained when exposing with an electron beam because the energy absorption in the resist layer during exposure is not linear but reaches a maximum at about two-thirds of the beam penetration range. In optical exposure of photoresists, however, energy absorption is highest at the top of the resist layer and lowest at the interface between the resist and the underlying substrate due to light attenuation in the resist. Standing wave effects created by light reflecting back from the substrate further complicate the situation. It is thus ordinarily impossible to obtain an undercut profile or even a vertical profile with normal optical exposure and normal development of the commonly used positive photoresists, such as the alkali soluble resin-diazo ketone photoresists.

A technique that has been used in electron beam lithography to increase sensitivity while maintaining an undercut profile consists of coating the substrate with two or more resists having widely different solubilities in a developer. The top resist layer is chosen so that it develops much more slowly than the underlying layer(s) in order to produce an undercut profile. U.S. Pat. No. 3,934,057 describes such a technique in more detail. This technique cannot be applied well, however, to alkali resin-diazo ketone photoresists because it is too difficult to coat two distinct layers of this resist type without excessive mixing at the interface even when the first layer is baked at the maximum allowable temperature before applying the second coat.

A similar two-layer technique using photoresist is described in an article entitled "Double-Resist Layer Shadow Masking" by T. Gardner et al, IBM Technical Disclosure Bulletin, Vol. 19, No. 1, June 1976, pp. 156-7. In this method a first layer of positive photoresist is deposited, dried and uniformly exposed. Then a second layer of positive photoresist is deposited, dried and pattern exposed. An undercut profile is produced upon development because the lower layer was exposed everywhere. This technique has the disadvantage of requiring two separate exposure steps with a resist deposition step in between. Furthermore, the lower layer will dissolve when applying the upper layer with many commonly used photoresist compositions including the alkali soluble resin-diazo ketone resists.

Another two-layer technique using photoresist is described, for example, in Applied Physics letters, Vol. 31, No. 5, September 1977, pp. 337-9, and entitled "Offset Masks for Lift-off Photoprocessing." In this method in order to prevent the bottom photoresist layer from becoming dissolved during deposition of the top photoresist layer, a thin intermediate metallic layer is deposited to protect the lower resist layer during deposition of the top photoresist layer. The top layer is developed and used as a mask for etching through the intermediate metallic layer. Then the intermediate metallic layer and overlaying top resist layer act as a mask during development of the bottom resist layer. This involves still more additional processing steps.

Techniques are also known for treating the surface of a single layer of alkali soluble resin-diazo ketone photoresists so that an undercut profile develops. U.S. Pat. No. 4,007,047 describes a process wherein the photoresist layer is treated with hydrogen ion by dipping the layer in an acid bath. This is said to decarboxylate the exposed sensitizer molecules. The present invention also involves the step of treating the resist surface with a liquid, namely a solvent, but the solvents used are substantially pH neutral.

In an article entitled "Single layer Optical Lift-off Process" by R. Bergin et al, IBM Technical Disclosure Bulletin, Vol. 18, No. 5, October 1975, p. 1395, a technique is described for obtaining an undercut profile in a phenolformaldehyde diazo ketone resist layer by treating the layer with a solution of a thermal free radical initiator so that cross-linking occurs in the upper regions of the layer. The solvents used with the present technique do not initiate cross-linking in the resist.

In another article entitled "Single Coat Photoresist Lift-off Structure" by C. Johnson et al, IBM Technical Disclosure Bulletin, Vol. 19, No. 3, August 1976, p. 859, a technique is described for obtaining an overhang or undercut profile in phenolformaldehyde diazo ketone resist by treating the resist layer with an oxygen plasma. The solvents used in the present technique do not oxidize the resist surface.

It should be noted that all of these photoresist surface treatment techniques cause a molecular modification of the resist material or a component thereof in the region near the top surface so as to make this region less soluble thereby producing an undercut profile. The solvents used in the present invention are not believed to be chemically reactive with any of the resist constituents, so that resist treatment does not modify or change the structure of molecules in the resist material.

U.S. Pat. No. 3,961,100 describes another resist surface treatment which increases the effective electron beam sensitivity of a diazo ketone resist. In this process an electron beam sensitive diazo ketone resist film is contacted with a developer solution, washed with water and dried prior to exposure to an electron beam. While the mechanism of this treatment was not described, it was speculated that the developer solution increases the wettability of the resist film such that when thereafter contacted with water, a "surface reaction" occurs to form a "skin" on the surface of the resist film.

The present invention pertains to light exposing of resist films rather than electron beam exposing thereof and does not employ a treating solution which chemically attacks or reacts with the resist, which developer solutions will do by definition.

BRIEF SUMMARY OF THE INVENTION

A simple additional procedural step has now been found which modifies the resist profile obtained with alkali soluble resin-diazo ketone resist. This additional step is the step of treating the resist layer with a solvent or solvent mixture which is different from but miscible with the solvent or solvent mixture used to form the resist layer and which does not dissolve the resist layer. The treating solvent being miscible with the resist solvent apparently mixes with the resist solvent in a surface region of the resist layer and at least partly displaces and substitutes for the resist solvent in the surface region. This alters or modifies the developer attack in the surface region affected by the solvent modification and in general seems to retard developer attack resulting in an undercut profile. Treating solvents which have been found to be effective in producing an undercut profile include aromatic solvents such as chlorobenzene, bromobenzene, fluorobenzene, benzene, xylene and toluene. Some nonaromatic solvents also affect the resist layer and modify development. The required length of time of the solvent treatment varies greatly with process conditions as well as with the composition of the treating solvents. In general the solvent treatment may be done either before or after pattern exposure of the resist layer and either before or after the resist bake, though the required length of time of the treatment is affected by this selection.

BRIEF DESCRIPTION OF THE DRAWINGS

FIG. 5 is a graph of overhang thickness as a function of resist bake time.

FIG. 6 is a graph of overhang thickness as a function of resist bake temperature.

DETAILED DESCRIPTION

Figure 1:
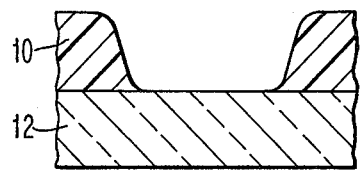
FIG. 1 illustrates the conventional overcut resist profile obtained ordinarily when developing alkali soluble resin-diazo ketone photoresists.

The foregoing and other objects, features and advantages of the invention will be apparent from the following more particular description of the invention.

The positive resists which are useful in the process of the invention include an alkali soluble resin. Examples of such resins are prepolymerized phenolformaldehyde resins which can be prepared by the acid or base catalyzed condensation of formaldehyde with an excess of a phenol having the formula

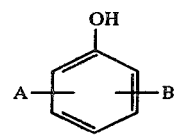

where A and B are selected from the group consisting of hydrogen and alkyl groups containing one to six carbon atoms. Suitable resins are described for example in U.S. Pat. No. 3,201,239, which is hereby incorporated by reference. Such resins are commercially available, e.g., those known under the trademark Alnoval.

Suitable sensitizers are diazo ketones having diazo and keto groups at adjacent positions on the molecule, such as the napthoquinone-(1,2)-diazide sulfonic acid esters which are described in U.S. Pat. Nos. 3,046,118, 3,046,121, 3,106,465, 3,148,983, 3,201,239 and 3,666,473 which are hereby incorporated by reference. Examples are described in U.S. Pat. No. 3,201,239 which have the general formula

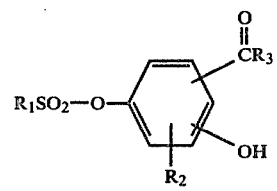

in which $R_1$ is a napthoquinone-(1,2)-diazide radical, $R_2$ is selected from the group consisting of hydrogen and hydroxyl, and $R_3$ is selected from the group consisting of hydrogen, alkyl, aryl, alkoxy, aryloxy, amino, and heterocyclic groups. Examples are also described in U.S. Pat. No. 3,046,118, which have the general formula

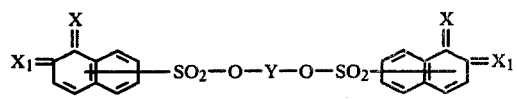

in which X and $X_1$ are $N_2$ or O, those attached to the same ring being different, and Y is an organic linkage containing at least one arylene, substituted arylene or heterocyclic radical. Further examples are described in U.S. Pat. No. 3,046,121, which have the general formula

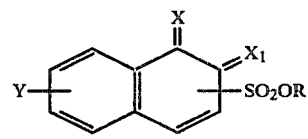

in which X and $X_1$ are selected from the group consisting of $N_2$ and O and are different, Y is selected from the group consisting of hydrogen and halogen, and R is a substituted or unsubstituted aryl or heterocyclic radical: and U.S. Pat. No. 3,106,465 which have one of the general formulae

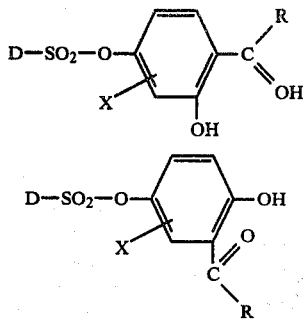

wherein D stands for a napthoquinone-(1,2)-diazide radical, X stands for a member selected from the group consisting of H and OH, R stands for a member selected from the group consisting of hydrogen, $OR_1$, $NR_2R_3$, alkyl-, aryl- and heterocyclic radicals, where $R_1$ stands for a member of the group consisting of alkyl and aryl, and $R_2$ and $R_3$ stand for a member of the group consisting of hydrogen, alkyl and aryl, $R_2$ equalling $R_3$ or being different from $R_3$. Still more examples are described in U.S. Pat. No. 3,148,983, which have the general formula

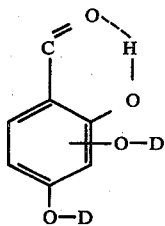

in which R is an aryl or substituted aryl radical and D is selected from the group consisting of naphthoquinone-(1,2)-diazide-(2)-4-sulfonyl and napthoquinone-(1,2)-diazide-(2)-5-sulfonyl radicals. Examples of such sensitizer compounds are the 2,3,4-trihydroxybenzophenone esters of 1-oxo-2-napthalene-5-sulfonic acid. The sensitizers are conventionally employed in amounts of from about 12 to 30% by weight of the resin components of the resist formulation.

The resist components are dissolved in an organic solvent or solvent mixture so that the resist can be coated as thin layers on various substrates. Hereinafter the term "solvent" shall also be construed to include mixtures of solvents. Suitable solvents include, for example, ethers, esters, and ketones such as methyl or ethyl cellosolve acetate, with or without minor amounts of butyl acetate and xylene; glycol monomethyl ether, glycol monoethyl ether; and aliphatic ketones such as methyl isobutyl ketone and acetone. The solids content of the resist solutions conventionally ranges from about 10 to 40% by weight. Such resist solutions are commercially available, e.g., those known under the AZ trademark of the Azoplate Division of the American Hoechst Corp. as AZ resists such as Shipley AZ-1350J.

According to conventional procedure, when the resist layer is exposed to actinic light, some of the sensitizer is converted from a base insoluble to a base soluble form. The adjacent diazo ketone groups are believed to form a carboxyl group which makes the exposed sensitizer molecules base soluble. A positive relief image is developed by treating the resist layer with an alkaline solution such as an aqueous solution of a mixture of sodium meta-silicate and sodium phosphates in dilute NaOH. Such developer solutions preferentially remove the exposed portions of the resist layer.

Figure 2:
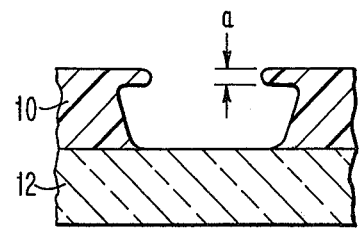
FIG. 2 illustrates the undercut resist profile obtained with such resist using the method of this invention.

According to the process of the invention, the deposited resist layer is treated with a solvent so as to alter the solubility characteristics of a surface portion of the layer, thereby modifying the resist profile formed upon developing the layer. Preferably, the surface portion of the layer should thereby be made less soluble in the selected developer than the underlying portion of the layer. This tends to change the resist profile from an overcut profile (FIG. 1) to an undercut profile (FIG. 2). FIGS. 1 and 2 are cross-sectional views of developed resist layers 10 on underlying substrates 12. FIG. 1 illustrates the conventional profile obtained with optically exposed alkali soluble resin-diazo ketone resist and FIG. 2 illustrates the profile obtained with such resist using the invention. Intermediate profiles may also be obtained, such as a profile having vertical side walls. While it seems possible that the treated surface portion alternatively could be made more soluble in the developer than the underlying portion of the layer using the present general technique, this would effectively decrease the sensitivity of the resist layer and produce a resist profile of no known present utility.

Aromatic solvents such as, for example, chlorobenzene, bromobenzene, fluorobenzene, benzene, xylene and toluene have been found to be useful in accomplishing the change in solubility. Experimental tests have shown that nonaromatic solvents also change the solubility of the surface portion, such as, for example, trichloroethylene, kerosene and methyl cyclohexane.

According to the invention, the resist layer is treated with a solvent different from but miscible with the solvent used to dissolve the resist components to form the layer. The resist layer is preferably soaked in the treating solvent for a controlled period of time. It has been found that the most effective and therefore preferred treatment solvents are those in which the treatment solvent and the solvent of the resist are infinitely miscible, but other miscible solvents also produce an effect. Obviously, the treating solvent must not completely dissolve the resist layer, although it may fractionally dissolve some resist constituents. With suitable process conditions and to some extent with proper selection of resist solvent and treating solvent, it has been found that the solvent treatment may be done at virtually any time following formation of the resist layer. Without intending to be limited thereby, an overhang resist profile has been formed by soaking the resist layer in a suitable solvent at any one of the following stages in the resist process: after air drying the resist layer but before baking it; after baking the resist layer but before exposing it; and after exposing the resist layer. The process has been found to be affected by the selection of treating solvent, the length of time and temperature of the treatment, the point in the resist process at which treatment occurs, baking conditions, developing conditions, and to a minor extent the optical exposure conditions.

The mechanism by which the process of the present invention alters solubility is not well understood. Even a baked resist film still contains within the film a quantity of the solvent used to form the film. This residual resist solvent seems to act as a binder for the other resist components. Since this solvent in the resist layer must be miscible with the treating solvent, mixing thereof seems to occur in the surface portion of the layer resulting in dilution of the resist solvent. It is believed that the treating solvent at least partly replaces the resist solvent in the surface portion, thereby in effect converting this portion of the layer to a new resist system having substantially the same resin and photoactive compound sensitizer but a different solvent binder. Solvent substitutions which result in a resist system having different solubility in the developer thereby produce a modified profile. Since resists in common use have been carefully formulated for maximum sensitivity, any change in the solvent portion of the resist system in the surface portion of the layer seems to reduce developer solubility of that portion and tends to produce an overhang profile.

The reduced solubility may alternatively occur because of a change in miscibility between the solvent in the resist layer and the alkaline developer solution. The aromatic solvents, for example, are not very miscible with an alkaline developer solution, while the solvent commonly used to form an alkali soluble resin-diazo diazo ketone resist (largely cellosolve acetate) is miscible with the commonly used developer solutions. A solvent substitution thus may tend to block diffusion of the developer into the resist layer structure.

Another possibility is that the treating solvent may act to dry or partially remove the resist system solvent while not itself remaining in the resist layer after treatment, thus locally densifying the surface portion of the layer and making it less soluble in the developer.

Another mechanism which seems to occur at least with some treating solvents is a fractional dissolution by the treating solvent of the lower molecular weight constituents of the resin component of the resist layer. Such fractional dissolution has been confirmed experimentally by mass spectrometry. Experimental tests have also shown that the treating solvent does not chemically react with any constituent of the resist system.

The above procedure is further illustrated by, but is not intended to be limited to, the following Examples wherein parts are parts by weight unless otherwise indicated.

GENERAL EXPERIMENTAL PROCEDURE

EXAMPLE I

Thermally oxidized silicon substrates were spin coated with a layer of photoresist to a thickness within the range of about 1 to 2 microns. The resist contained about 30 percent by weight solids of which about 75% was an alkali soluble resin, namely a phenolformaldehyde novolak resin, and about 25% was a diazo ketone sensitizer. The resist sensitizer was a mixed ester of a naphthoquinone-(1,2)-diazide sulfonic acid, namely a 2,3,4-trihydroxybensophenone mixed ester of 1-oxo-2-diazo-naphthalene-5-sulfonic acid. The resist solvent was cellosolve acetate with minor amounts of certain solvent additives which are not believed to remain in the resist layer after drying. The mixture was about 80% cellosolve acetate, 10% butyl acetate and 10% xylene. The resist coated substrates were then baked at a temperature within the range of about 70° to 80° C. for a period of time within the range of about 10 to 30 minutes. After baking, the resist layers were exposed through a pattern mask to actinic radiation of approximately 3000 Å to 4500 Å wavelength at a power of about 40 mw/cm$^2$ for a period of time within the range of about 10 to 40 seconds. At some point in this procedure the resist coated substrates were soaked in a solvent at room temperature for a period of time within the range of about 5 to 30 minutes and air dried. The dried resist layers then were completely developed in a conventional aqueous alkaline developer solution which was a buffered NaOH solution. Development times ranged from 0.1 minute to 15 minutes. The developed resist layers were then rinsed in deionized water and dried.

EXAMPLE I

Samples were soaked in chlorobenzene after exposure for various soaking periods. A control sample which was not treated with the chlorobenzene solvent exhibited an overcut resist profile as shown in FIG. 1, while the chlorobenzene treated samples had an undercut profile as shown in FIG. 2.

Figure 3:
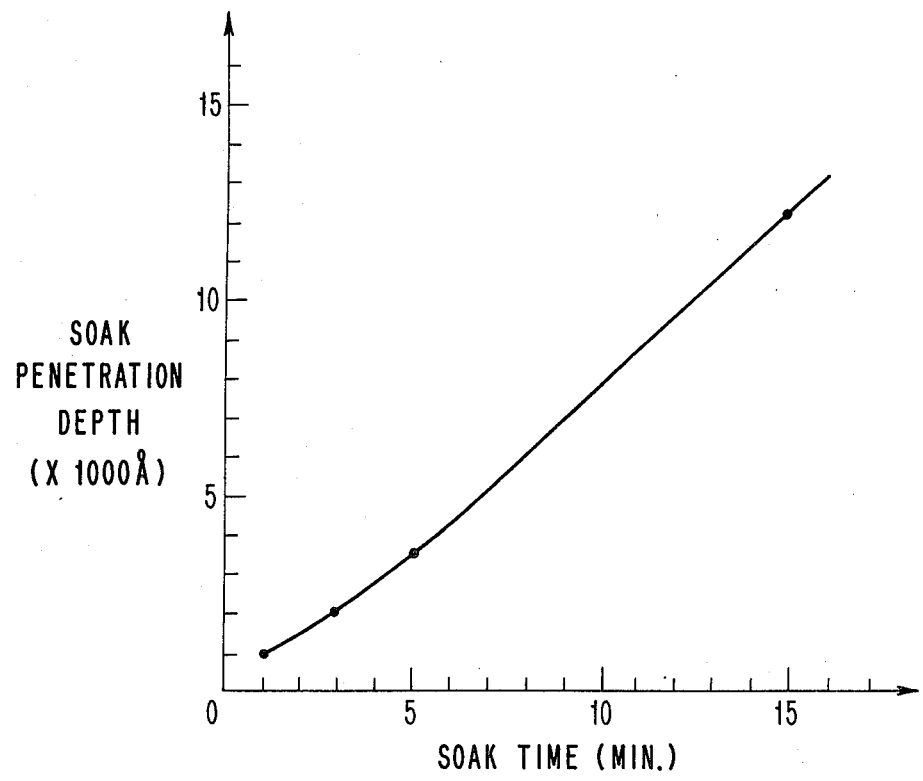
FIG. 3 is a graph of treating solvent penetration depth as a function of treatment time for a preferred treatment solvent.

The thickness of the modified surface portion of the resist layers was measured indirectly by measuring the thickness (defined as dimension a in FIG. 2) of the overhang portion and also more directly by continuously measuring the thickness of the resist layer during development with a Film Thickness Analyzer. The film thickness was found to slowly decrease (slowly develop) even in the exposed regions until the interface between the modified and unmodified layers of resist was reached. At this point development proceeded at the normal faster rate of the untreated sample. FIG. 3 shows a graph of the thickness of the modified surface layer portion as a function of chlorobenzene soaking time. The modification rate appears to be almost linear with time with an approximate value of 800 Å per minute. This linearity suggests that a diffusion limited process occurs.

EXAMPLE II

The soaking solvent was again chlorobenzene but the soaking treatment was done before UV exposure. The same type of overhang was obtained, but the soaking time had to be doubled for the same overhang thickness as obtained by soaking after exposure.

EXAMPLE III

Samples were again soaked in chlorobenzene after exposure but various different exposure doses were used. At higher exposures the resist profile in the unmodified (bottom) portion of the resist layer became more vertical while the profile of the modified (top) portion remained substantially not affected by exposure dose.

EXAMPLE IV

The experiment of Example II was again repeated except that after solvent treatment and before exposure, the resist was baked again at about 70° to 80° C. for about 15 minutes. The overhang profile showed no substantial change from Example II.

EXAMPLE V

In this experiment the resin content of the resist was increased by about 20%. Again the samples were soaked in chlorobenzene after exposure. The same overhang profile was obtained but the side surface of the profile was smoother.

EXAMPLE VI

Figure 4:
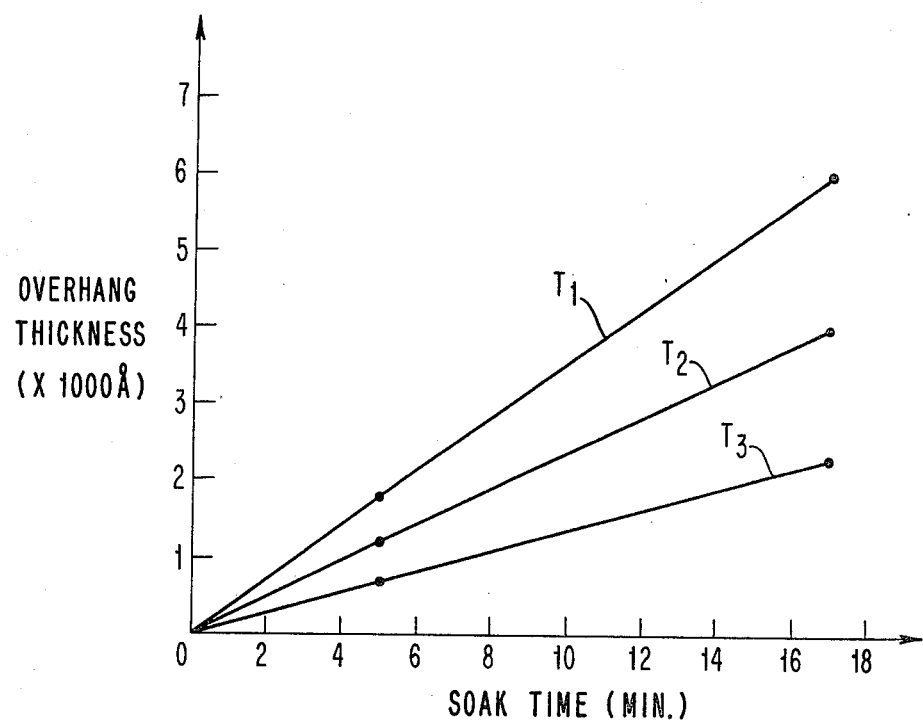
FIG. 4 is a graph of overhang thickness as a function of treatment time for various resist bake temperatures.

Before exposure different samples were baked at the temperatures of $T_1 = 66°$ C., $T_2 = 72°$ C., and $T_3 = 80°$ C. for 30 minutes. After exposure the samples were soaked in chlorobenzene for time periods of 5 minutes and 17 minutes. Overhang thicknesses resulting therefrom are graphically presented in FIG. 4. This graph shows that the penetration rate of the solvent is lowered by increasing the bake temperature. This supports the hypothesis that the process is diffusion rate limited since a higher baking temperature causes the resist molecules to be more tightly packed, which would be expected to slow diffusion. In FIG. 6, overhang thickness is plotted as a function of baking temperature for the 17 minute baking time data. The steep slope of this plot illustrates the strong dependence of overhang thickness on baking temperature.

EXAMPLE VII

Samples were baked at 75° C. for different baking periods, then exposed, treated with chlorobenzene for 17 minutes and developed. The amount of overhang thickness is presented in FIG. 5, which shows that the overhang thickness and therefore penetration rate goes down as the baking period increases. This also supports the diffusion theory, since the resist gradually densifies during baking.

EXAMPLE VIII

Samples were soaked in chlorobenzene after exposure except that the solids content of the developer was doubled in one experiment and halved in another experiment while the developing time was modified accordingly to obtain complete development. An overhang profile was obtained in each case.

EXAMPLE IX

After exposure, different samples were treated with fluorobenzene, bromobenzene, toluene and xylene. An overhang profile developed from treating samples with any of these solvents. However, it was found that the use of xylene required a longer soaking time of about 60 minutes.

EXAMPLE X

After exposure, samples were soaked in xylene at 40° C. instead of room temperature and the required soaking time was thereby shortened considerably. Even with a soak time of only 1 minute, an overhang profile was produced.

EXAMPLE XI

Samples were soaked in xylene before the baking step and the soaking time was shortened to about 5 minutes. The same type of overhang profile was produced.

EXAMPLE XII

Different samples were soaked (after exposure) in certain nonaromatic solvents, namely methyl cyclohexane, trichloroethylene, kerosene and chloroform. No overhang profile was produced with any of these solvents but the solubility rate ratio was improved with all but chloroform. This means that while the developer solubility of the surface layer was not reduced enough in these experiments to produce an overhang profile, it was still reduced sufficiently to improve the solubility ratio between unexposed and exposed regions. The total loss of resist thickness in unexposed regions of the resist was reduced. Similar solubility rate ratio improvement occurred without producing overhang when xylene was used as a soaking solvent (after baking) for a period of only 5 minutes. Since xylene turned out to be a suitable solvent for producing overhang when the soaking conditions were suitable, it is thus suggested that methyl cyclohexane, trichloroethylene and kerosene will also be suitable under appropriate soaking conditions. Treatment with chloroform on the other hand produced a resist layer which did not develop. Under these process conditions, chloroform might thus be considered overeffective while other solvents were undereffective. Chloroform might also be a suitable solvent if the effective treatment time were sufficiently reduced.

EXAMPLE XIII

After exposure, samples were soaked for 5 minutes in benzene. The resist profile that developed was substantially vertical, exhibiting neither an overcut or undercut characteristic. It may be assumed from experience with xylene that benzene will produce an undercut when the effective treatment time is suitably lengthened.

EXAMPLE XIV

Samples were soaked in the following solvents: cyclohexanone, ethyl acetate, phenol, and ethylene glycol. Cyclohexanone, ethyl acetate and phenol all dissolved the resist layer and therefore appear to be unsuitable as treating solvents for the phenolformaldehyde-diazo ketone-cellosolve acetate resist system. Ethylene glycol produced no effect and was found to be immiscible with the resist solvent. Ethylene glycol therefore appears to be unsuitable as a soaking solvent for a resist system employing cellosolve acetate.

EXAMPLE XV

Separate infrared spectra were obtained of cresol-formaldehyde novolak resin and of the diazo ketone sensitizer heretofore described in the General Experimental Procedure section. Then these components were soaked separately in chlorobenzene for 16 hours, dried and separate infrared spectra of these components were again obtained. No difference could be detected in the infrared spectra as a result of the soaking except for the presence of some residual chlorobenzene. There was also no significant shift or intensity change in the OH absorption of either component, which indicates that no $H^+$ bonding occurs between the resist components and the chlorobenzene.

EXAMPLE XVI

A solution was prepared of cresol-formaldehyde novolak resin in a mixture of about 80% cellosolve acetate, 10% butyl acetate and 10% xylene. No diazo ketone sensitizer was included. This polymeric solution was then coated on two silicon wafers. One wafer was soaked in toluene for 15 minutes and the wafers were then developed. The unsoaked resist layer developed completely in 2 minutes while the toluene soaked resist layer experienced no loss of thickness for 7 minutes, at which time the film lifted off the substrate due to poor adhesion.

While the invention has been particularly shown and described with reference to preferred embodiments thereof, it will be understood by those skilled in the art that changes in form and details may be made therein without departing from the spirit and scope of the invention.

What is claimed is:

1. A method of producing a positive resist image having a sidewall profile with reduced overcut, which consists essentially of the following steps in sequence:

depositing on a substrate surface a layer comprising a mixture of an alkali soluble resin, a light sensitive sensitizer having diazo and keto groups at adjacent positions on an aromatic ring and a first solvent;

baking the layer at an elevated temperature to remove most of the solvent in the layer;

imagewise exposing the layer to actinic light to alter the solubility characteristics of the exposed portion of the layer;

treating the layer with a second solvent which is incapable of completely dissolving the layer and which is different from but miscible with the solvent still remaining in the layer so as to reduce the alkali solubility of only a surface region of the layer; and treating the layer with an alkali developer solution until the exposed portion of the layer has been completely dissolved away, the reduced alkali solubility of the surface region of the layer reducing the overcut of the developed sidewall profile.

2. The method of claim 1 wherein the alkali solubility of said surface region is sufficiently reduced to reduce the overcut of the developed sidewall profile to an undercut profile.

3. The method of claim 1 wherein said alkali soluble resin consists essentially of a phenolformaldehyde resin.

4. The method of claim 1 wherein said diazo ketone sensitizer consists essentially of naphthoquinone-(1,2)-diazide sulfonic acid esters.

5. The method of claim 4 wherein said first solvent comprises cellosolve acetate.

6. The method of claim 5 wherein said second solvent is an aromatic solvent.

7. The method of claim 6 wherein the alkali solubility of said surface region is sufficiently reduced to reduce the overcut of the developed sidewall profile to an undercut profile.

8. The method of claim 5 wherein said second solvent is selected from the group consisting of chloroform, trichloroethylene, kerosene and methyl cyclohexane.

9. The method of claim 6 wherein said second solvent is selected from the group consisting of chlorobenzene, bromobenzene, fluorobenzene, benzene, toluene and xylene.

10. The method of claim 9 wherein said alkaline developer is a buffered aqueous NaOH solution.

11. The method of claim 1 wherein said first solvent comprises cellosolve acetate.

12. The method of claim 11 wherein said second solvent is an aromatic solvent.

13. The method of claim 12 wherein said second solvent is selected from the group consisting of chlorobenzene, bromobenzene, fluorobenzene, benzene, toluene, and xylene.

14. The method of claim 11 wherein said second solvent is selected from the group consisting of chloroform, trichloroethylene, kerosene and methyl cyclohexane.

15. The method of claim 1 wherein said first solvent consists essentially of about 80% cellosolve acetate, about 10% butyl acetate and about 10% xylene.

16. The method of claim 1 wherein said layer is treated with said second solvent at an elevated temperature to shorten the period of said treatment.

17. A method of producing a positive resist image having a sidewall profile with reduced overcut, which consists essentially of the following steps in sequence:

depositing on a substrate surface a layer comprising a mixture of an alkali soluble resin, a light sensitive sensitizer having diazo and keto groups at adjacent positions on an aromatic ring and a first solvent;

at least partly drying the layer in air to remove some of the first solvent;

treating the layer with a second solvent which is incapable of completely dissolving the layer and which is different from but miscible with the solvent still remaining in the layer so as to reduce the alkali solubility of only a surface region of the layer;

baking the layer at an elevated temperature to remove most of the solvents in the layer;

imagewise exposing the layer to actinic light to alter the solubility characteristics of the exposed portion of the layer; and treating the layer with an alkali developer solution until the exposed portion of the layer has been completely dissolved away, the reduced alkali solubility of the surface region of the layer reducing the overcut of the developed sidewall profile.

18. The improvement of claim 17 wherein the alkali solubility of said surface region is sufficiently reduced to reduce the overcut of the developed sidewall profile to an undercut profile.

19. The improvement of claim 17 wherein said alkali soluble resin consists essentially of a phenolformaldehyde resin.

20. The improvement of claim 17 wherein said diazo ketone sensitizer consists essentially of naphthoquinone-(1,2)-diazide sulfonic acid esters.

21. The improvement of claim 20 wherein said second solvent is an aromatic solvent.

22. The method of claim 17 wherein said second solvent is xylene.

23. A method of producing a positive resist image having a sidewall profile with reduced overcut, which consists essentially of the following steps in sequence:

depositing on a substrate surface a layer comprising a mixture of an alkali soluble resin, a light sensitive sensitizer having diazo and keto groups at adjacent positions on an aromatic ring and a first solvent;

baking the layer at an elevated temperature to remove most of the solvent in the layer;

treating the layer with a second solvent which is incapable of completely dissolving the layer and which is different from but miscible with the solvent still remaining in the layer so as to reduce the alkali solubility of only a surface region of the layer;

imagewise exposing the layer to actinic light to alter the solubility characteristics of the exposed portion of the layer; and treating the layer with an alkali developer solution until the exposed portion of the layer has been completely dissolved away, the reduced alkali solubility of the surface region of the layer reducing the overcut of the developed sidewall profile.

24. The improvement of claim 23 wherein the alkali solubility of said surface region is sufficiently reduced to reduce the overcut of the developed sidewall profile to an undercut profile.

* * * * *

UNITED STATES PATENT AND TRADEMARK OFFICE
CERTIFICATE OF CORRECTION

PATENT NO. : 4,212,935                           Page 1 of 2

DATED : July 15, 1980

INVENTOR(S) : Canavello et al.

It is certified that error appears in the above-identified patent and that said Letters Patent are hereby corrected as shown below:

Column 2, line 24, "overlaying" should read --overlying--.

Column 5, lines 27-36, the formula should be as follows:

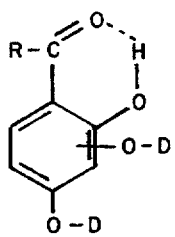

Column 12, the following claims should have been included:

25. The improvement of claim 23 wherein said alkali soluble resin consists essentially of a phenolformaldehyde resin.

26. The improvement of claim 23 wherein said first solvent comprises cellosolve acetate.

UNITED STATES PATENT AND TRADEMARK OFFICE
CERTIFICATE OF CORRECTION

PATENT NO. : 4,212,935

DATED : July 15, 1980

INVENTOR(S) : Canavello et al.

It is certified that error appears in the above-identified patent and that said Letters Patent are hereby corrected as shown below:

27. The improvement of claim 26 wherein said second solvent is an aromatic solvent.

28. The method of claim 23 wherein said second solvent is chlorobenzene.

Signed and Sealed this

Tenth Day of March 1981

[SEAL]

Attest:

RENE D. TEGTMEYER

Attesting Officer     Acting Commissioner of Patents and Trademarks